United States Patent [19]

Carson et al.

[11] 4,074,137
[45] Feb. 14, 1978

[54] HEATED ION CHAMBER DETECTOR FOR A DYNAMOELECTRIC MACHINE

[75] Inventors: Chester C. Carson, Ballston Spa; Sterling C. Barton; Federico S. Echeverria, both of Scotia, all of N.Y.

[73] Assignee: General Electric Company, Schenectady, N.Y.

[21] Appl. No.: 719,838

[22] Filed: Sept. 2, 1976

[51] Int. Cl.$^2$ ............................................. G01T 1/18
[52] U.S. Cl. ................................. 250/380; 73/23.1; 73/339 R; 250/384
[58] Field of Search ...................... 250/380, 381, 384; 73/23.1, 28, 339 R

[56] References Cited

U.S. PATENT DOCUMENTS

| | | | |
|---|---|---|---|
| 3,046,396 | 7/1962 | Lovelock | 250/381 |
| 3,185,845 | 5/1965 | Lively et al. | 250/381 X |
| 3,427,880 | 2/1969 | Grobel et al. | 73/339 R |
| 3,916,671 | 11/1975 | Carson et al. | 73/23.1 |

*Primary Examiner*—Archie R. Borchelt
*Attorney, Agent, or Firm*—James W. Mitchell; John F. Ahern; Herbert E. Messenger

[57] ABSTRACT

An improved detector apparatus is provided in combination with a gas cooled dynamoelectric machine for detecting the presence of pyrolysate products in the machine gas coolant indictive of localized overheating of certain dynamoelectric machine parts. The detector apparatus is of the type which analyzes an ionized gas sample by measuring the current flow in the gas sample. A decrease in current flow is indicative of the presence of submicron particulates. The present invention resides in heating the gaseous sample to eliminate more volatile submicron particulates so that the output signal from the detector apparatus is indicative only of the presence of pyrolysate products resulting from the localized overheating of certain dynamoelectric machine parts.

2 Claims, 2 Drawing Figures

HEATED ION CHAMBER DETECTOR FOR A DYNAMOELECTRIC MACHINE

BACKGROUND OF THE INVENTION

This invention relates, in general, to a detector apparatus for detecting submicron particulates in a gaseous carrier; and, in particular, this invention is particularly useful for detecting localized overheating within the core of a gas cooled dynamoelectric machine.

Localized overheating may occur in the stator core of a large gas cooled dynamoelectric machine causing damage to the core which can lead to extensive machine outage and costly repairs. One of the ways in which localized overheating can occur is by damage to the surface of the stator teeth such that electrical contact can take place between core laminations leading to a flow of electric current and resistance heating when the machine is under load. Localized overheating of this nature can generate enough heat to melt the core laminations. It is therefore highly desirable to provide an apparatus for the early detection of localized overheating in a dynamoelectric machine so that the machine load can be reduced and corrective action taken prior to the occurrence of severe damage.

In U.S. Pat. No. 3,573,460 to Skala, issued Apr. 6, 1971, a device is described which will detect the presence of submicron particulates in a gaseous carrier. The patented device comprises an ionization section having a radioactive source applied thereto and a detector section having a voltage source applied thereto. The carrier gas is ionized and a current measurement is taken across the ionized gas flowing between two oppositely charged electrodes to detect the presence of submicron particulates. The electrical conductivity of the ionized gas changes if submicron particulates are entrained in the carrier gas and hence the detected current will decrease because of the collision of ions in the gas with any submicron particulates, since these ions will attach themselves to those particulates and will not contribute to the ion current. The device described in the Skala patent may be generally referred to as an ion chamber detector.

In U.S. Pat. No. 3,427,880 to Grobel et al, issued Feb. 18, 1969, parts of a gas cooled dynamoelectric machine are coated with a selected polymeric material which will decompose at a relatively safe temperature to produce submicron pyrolysate particulates. These pyrolysates may be detected in a device such as the ion chamber detector, and hence, an early advanced warning of localized overheating may be obtained when the ion chamber detector is used in combination with a gas cooled dynamoelectric machine. One example of a coating material is a polyalphamethylstyrene polymer which will commence to give off decomposition particles (pyrolysates) at about 185° C (365° F) in a pressurized hydrogen atmosphere, as measured in one experiment using an ion chamber detector.

Within the environment of a gas cooled dynamoelectric machine, non-pyrolysate particulates may become entrained in the machine gas coolant. Such non-pyrolysate particulates are not due to machine overheating but may, for example, be due to oil mist particles given off from the oil used with the machine shaft seals. While the presence of oil mist particles may be of interest, their presence can adversely affect the desired operation of the ion chamber detector to identify pyrolysates due to localized overheating. The oil mist particles can also pick up ions in the ion chamber detector upon collision with them, thus preventing them from contributing to the ion current and, in a manner similar to pyrolysates, causing a drop in the ion current and a false signal which could lead to a premature or unnecessary machine shutdown. On the other hand, the presence of oil mist vapor in the ion chamber detector can cause erratic readings in the ion chamber detector which can mask a true signal indicative of localized overheating.

OBJECTS OF THE INVENTION

It is one object of the present invention to provide an improved detector apparatus which will detect only certain types of submicron particulates.

It is another object of the present invention to provide an improved detector apparatus in combination with a gas cooled dynamoelectric machine which is sensitive only to selected pyrolysate particulates which are given off into the gas coolant due to localized machine overheating.

Conversely, it is another object of the present invention to provide an improved detector apparatus in combination with a gas cooled dynamoelectric machine which will obviate erratic or false signals indicative of localized overheating in the dynamoelectric machine.

BRIEF DESCRIPTION OF THE INVENTION

According to the present invention an improved ion chamber detector includes a mixing and ionizing section and a detector section. A heating band is formed about the mixing and ionizing section to raise the temperature of the carrier gas therein in order to gasify more volatile particulates which may become entrained in the gaseous carrier. Such particulates may be, for example, oil mist particles within the environment of a gas cooled dynamoelectric machine. While the more volatile particulates are converted to the gaseous state, the present invention does not significantly affect the less volatile pyrolysate particulates which may be indicative of localized overheating within the dynamoelectric machine. Hence, the sensitivity of the detector apparatus to pyrolysates remains the same while the improved construction obviates the possibility of either a false signal or erratic performance. In addition, a new radiation source construction in the form of a cylinder having thorium oxide ceramic elements is disclosed to provide a radiation source which is stable in the presence of the heated carrier gas.

DETAILED DESCRIPTION OF THE INVENTION

Figure 1:
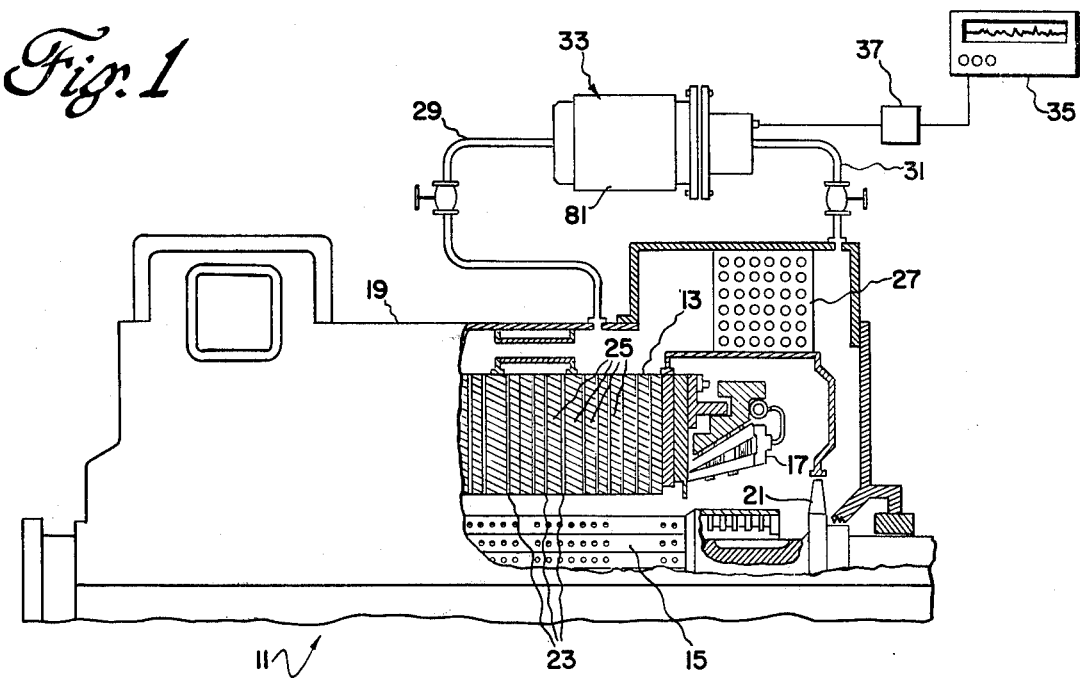
FIG. 1 is an elevation view of the present invention as applied to a dynamoelectric machine which is shown in partial cross section.

FIG. 1 shows a hydrogen cooled generator 11 as being typical of a gas cooled dynamoelectric machine with which the present invention may be used in combination to detect localized overheating which may occur within the dynamoelectric machine. Generator 11 includes a stator 13, a rotor 15, stator winding 17, portions of which run axially through the stator in a manner well known. The stator, rotor and stator windings are all enclosed in a gas tight casing 19 filled with a gaseous coolant, for example hydrogen. The stator winding themselves may, in addition, be cooled internally with a liquid. A rotor mounted fan 21 circulates coolant gas to suitably arranged passages within the gas tight casing which may include, for example, radial ducts 23 formed between lamination packages 25. The gas is cooled in a heat exchanger 27 and returned to the suction side of fan 21.

A sample of the gaseous coolant is withdrawn from the generator casing by means of a pipe 29 which may be conveniently attached to the high pressure side of the generator. The sample gas may be returned to the machine casing by a pipe 31 attached on the low pressure side of the generator. Alternatively, sample gas may be directed to a suitable vent away from the machine. The pipe 29 and the pipe 31 are interconnected by a heated ion chamber detector 33 according to one aspect of the present invention which heated ion chamber detector is described in reference to FIG. 2. The heated ion chamber detector 33 provides an output signal to a recorder 35 through a signal amplifier 37.

Figure 2:
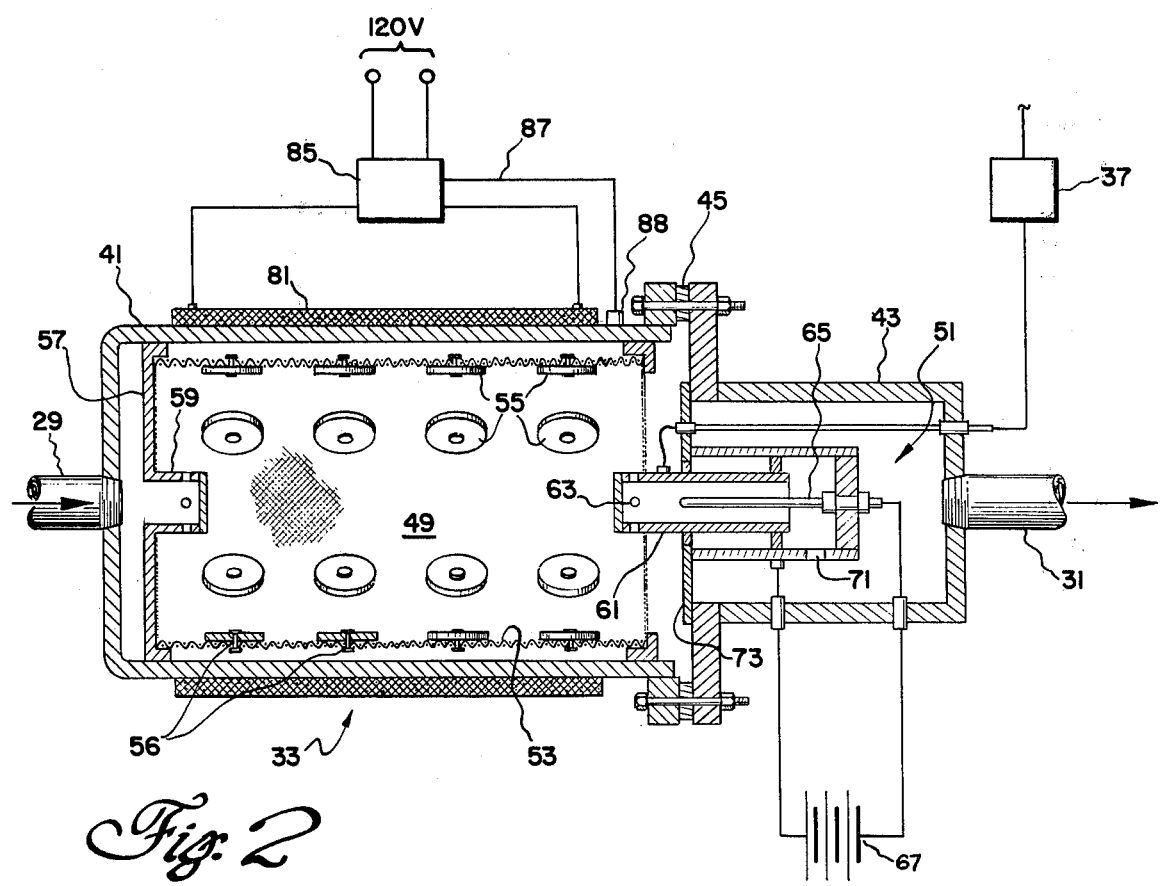
FIG. 2 is an enlarged elevation cross section of a heated ion chamber detector according to the present invention.

The heated ion chamber detector 33 is shown in FIG. 2 and comprises an outer shell which may be formed by bolting together a first section 41 and a second section 43. The two sections are heat insulated from one another by means of an insulating gasket 45. The first section encloses the gas mixing and ionizing chamber 49 whereas the second section includes a detection device shown generally at 51. The first section containing the gas mixing and ionizing chamber 49 is attached to the outlet end of pipe 29 for receiving the incoming gas sample to be tested. The gas mixing and ionizing chamber is defined by an open ended cylinder 53 which has affixed thereto a radiation source in the form of discrete radiation emitting elements 55. The upstream end of the cylinder is separated from the pipe 29 by means of an end wall 57 having an inlet nozzle 59 formed therewith to impart a turbulent flow to the incoming gas sample as it enters the chamber 49.

The detector section 43 includes a cylindrical collector electrode 61 having apertures 63 at one end thereof to admit ionized gas. Voltage is applied to a central electrode 65 from a suitable voltage source 67 to produce a gradient which will cause the gas ion to move toward the collector electrode 61, and produce a current which is measured by an electrometer amplifier 37. The gas flows through an outlet 71 and then to pipe 31 whereupon it is either routed back into the dynamoelectric machine or sent to a suitable vent. A wall 73 separates the gas mixing and ionizing chamber 49 from the detector section 43 except for the collector electrode 61. Reference again is made to U.S. Pat. No. 3,573,460 to Skala for a general description of an ion chamber detector not including the improved construction of the present invention.

According to one aspect of the present invention, the ion chamber detector is improved to great advantage for operation with a large gas cooled dynamoelectric machine by providing a heating means in combination with the ion chamber detector. In a preferred embodiment, the heating means is applied to the first section housing the gas mixing and ionizing chamber for the purpose of heating the ionizing gas to a temperature which will gasify more volatile non-pyrolysate particulates such as oil mist particles. The heating means may take the form of a band heater 81 which is applied to the outside circumference of the first section 41. Such a band heater is available from the Ogden Company under the designation HB455L50X (120V 890W). Heat control of the band heater is achieved by a thermostat 85 which may include a surface temperature feedback to the thermostat along line 87 from a thermocouple 88.

While the foregoing construction represents a preferred embodiment of the present invention, as thus far stated, it is understood that less desirable and less advantageous alternatives may fall within the scope of the present invention. One such alternative is to heat the incoming gas sample upstream from the ion chamber detector as, for example, by applying a band heater around pipe 29. This construction is less preferred since the gasified non-pyrolysate particulates may be condensed as they reach the ion chamber detector if it is at ambient temperature. Another alternative embodiment may be to provide a heat source within the ion chamber detector, but this is deemed to be less attractive in terms of simplicity of construction of the present invention.

In discussing the background of the invention, it was stated that according to U.S. Pat. No. 3,427,880 to Grobel et al certain portions of a gas cooled dynamoelectric machine may be coated with selected polymeric compositions which will decompose at elevated temperatures to produce decomposition products called pyrolysates. The detected decomposition of these selected polymers will give advance warning of localized overheating within the dynamoelectric machine. Coating polymers are selected on the basis of machine operating conditions. If it is desired that a relatively high temperature be allowed before an indication is given, it may be preferable to utilize the normal coating applied to the laminations, for example, the phenolformaldehyde polymer. This polymer will commence to give off decomposition particles in the neighborhood of 250° C in a pressurized hydrogen atmosphere. Actually, such continued decomposition of the normal lamination coating would lead to damage of the type which it is desired to prevent. Therefore, if preferred, special polymeric materials decomposing at lower temperatures than those which would damage the insulation or other parts of interest may be applied over the previously mentioned coating. These can be applied in areas of particular concern such as the tips of the stator teeth or inside the slot walls or on the duct spaces. The latter would give an indication of localized high temperature in the cooling ducts or around the stator teeth. Such coating materials employed to give advance warning of potential local damaging temperatures may comprise polyalphamethylstyrene, polystyrene, polymethyl methacrylate or cellulose propionate. These decompose and give off submicron decomposition particles rather abruptly as temperatures in the range of 165° – 190° C are reached in pressurized hydrogen. Other materials emitting decomposition particles at even lower temperatures are feasible. However, the pyrolysate particles that are produced are not gasified to a significant extent in the operating temperatures of the heated ion chamber.

On the other hand, a typical hydrogen seal oil used in large gas cooled dynamoelectric machines will produce an oil mist at temperatures as low as 124° C. It is determined by experiment that a typical oil mist could be gasified at a temperature of about 150° C. If, for example, the gas temperature in the ionization chamber of the present invention is raised to the range of 150° C to 250° C, then the more volatile non-pyrolysate oil-mist particles will be gasified prior to entering the detector section and there will be no false signal due to non-pyrolysate products. If the temperature is raised too high, some of the less volatile pyrolysate components could begin to gasify depending upon the selected polymeric material. Therefore, according to the objects of the present invention the more volatile non-pyrolysate materials will be gasified prior to entering the detector section whereas the less volatile pyrolysates from selected polymeric materials will be unaffected whereby only those selected pyrolysates will cause a signal on the ion chamber detector giving an accurate warning of machine overheating. The foregoing is merely exemplary of a preferred embodiment whereas the system may be designed within any practical range. It has further been found that in the preferred embodiment, the band heater can be controlled by feedback thermocouple 88 to maintain the temperature of the ionized gas in the temperature range of 150° C. Again, these temperature ranges are selected on the basis of a typical gas cooled dynamoelectric machine using typical polymeric coatings and hydrogen seal oils.

According to another aspect of the invention, it has been found that prior art radiation sources such as thorium impregnated rayon mantles become fragile and brittle after being subjected to the elevated temperatures of the hot ion chamber detector. In the environment of a large dynamoelectric machine and over prolong usage at elevated temperatures it is possible that the rayon mantle would deteriorate due to rough handling or vibrations. Accordingly, the present invention employs a new, thermally stable radiation source such as radioactive thorium 232 in the form of pieces of thorium oxide ceramic distributed over a metal cylindrical surface. Referring to FIG. 2, the thorium oxide ceramic may be in the form of discrete button-like elements 55 distributed over a wire mesh cylindrical screen wherein the buttons are applied to the screen by means of suitable fasteners 56. These thorium oxide ceramic elements are applied uniformly over the axial length of the gas mixing and ionizing chamber. The wire mesh screen may be stainless steel or alternatively a Nichrome metal sheet may be employed. Another alternative radiation source can be in the form of a cylinder consisting of a thorium oxide-yttrium oxide ceramic.

While there has been shown what is considered at present, to be the preferred embodiments of the invention, other modifications may occur to those skilled in the art; and, it is intended to cover in the appended claims all such modifications as fall within the true spirit and scope of the invention.

What is claimed is:

1. An improved apparatus of the type used for detecting the presence of pyrolysates in a gaseous carrier, said gaseous carrier being a coolant gas sample from a gas cooled dynamoelectric machine wherein certain machine parts are coated with selected materials which will decompose at an elevated temperature to produce said pyrolysates indicative of localized overheating of dynamoelectric machine parts; said apparatus comprising an outer shell including a gas mixing and ionizing section and a detector section, said detector section receiving said ionized gas sample from said gas mixing and ionizing section, said detector section including spaced electrodes having an applied voltage between which current flow occurs by means of the ionized gas to produce a variable signal the magnitude, of which, is proportional to the current flow; wherein the improvement comprises:

heater means applied to the gas mixing and ionizing section, said heater means providing a temperature range of from approximately 150° C to 250° C within the gas mixing and ionizing section whereby oil mist particles from the dynamoelectric machine may be gasified without affecting pyrolysates in the gaseous carrier; and, a radiation source within said gas mixing and ionizing section comprising a plurality of discrete radioactive ceramic elements supported along the axial length of said gas mixing and ionizing section.

2. The apparatus recited in claim 1 further comprising:

a cylindrical wire mesh support element disposed within said outer shell in the gas mixing and ionizing section; and, a plurality of discrete radioactive elements of thorium 232 oxide ceramic attached along the axial length of said support element.

* * * * *